(12) United States Patent
Jutsen

(10) Patent No.: US 6,701,298 B1
(45) Date of Patent: Mar. 2, 2004

(54) COMPUTERIZED MANAGEMENT SYSTEM AND METHOD FOR ENERGY PERFORMANCE EVALUATION AND IMPROVEMENT

(75) Inventor: Jonathan Jutsen, Sydney (AU)

(73) Assignee: Envinta/Energetics Group, North Sydney (AU)

( * ) Notice: Subject to any disclaimer, the term of this patent is extended or adjusted under 35 U.S.C. 154(b) by 0 days.

(21) Appl. No.: 09/376,443

(22) Filed: Aug. 18, 1999

(51) Int. Cl.⁷ .................... G06F 17/60; G01R 21/133
(52) U.S. Cl. .................. 705/7; 705/412; 700/291; 702/62; 702/188
(58) Field of Search ............... 702/62, 188; 705/412, 705/7; 700/291

(56) References Cited

U.S. PATENT DOCUMENTS

| | | |
|---|---|---|
| 4,979,122 A | 12/1990 | Davis et al. |
| 4,990,893 A | 2/1991 | Kiluk |
| 5,001,630 A | 3/1991 | Wiltfong |
| 5,216,623 A | 6/1993 | Barrett et al. |
| 5,237,507 A | 8/1993 | Chasek |
| 5,347,466 A | 9/1994 | Nichols et al. |
| 5,717,609 A * | 2/1998 | Packa et al. ............. 702/130 |
| 5,745,114 A | 4/1998 | King et al. |
| 5,758,331 A * | 5/1998 | Johnson ................. 705/412 |
| 5,794,212 A | 8/1998 | Mistr, Jr. |
| 6,088,688 A * | 7/2000 | Crooks et al. ........... 705/412 |
| 6,122,603 A * | 9/2000 | Budike, Jr. ............... 702/182 |
| 6,178,362 B1 * | 1/2001 | Woolard et al. .......... 700/295 |
| 6,269,624 B1 * | 8/2001 | Frutschi et al. ......... 60/39.02 |

OTHER PUBLICATIONS

Bartos, Power Management: Helps your Plant "Live Long and Prosper", Dec. 1998, Control Engineering, vol. 45 Issue 15, pp. 53–60.*

* cited by examiner

Primary Examiner—Tariq R. Hafiz
Assistant Examiner—Andre Boyce
(74) Attorney, Agent, or Firm—Pauley Petersen & Erickson

(57) ABSTRACT

A system and method for energy management in which data relating to energy usage and energy-related policies and practices is collected in an automated data processing device. The data is analyzed to arrive at a diagnosis of energy management effectiveness from which recommendations for improving the energy management effectiveness are generated.

18 Claims, 2 Drawing Sheets

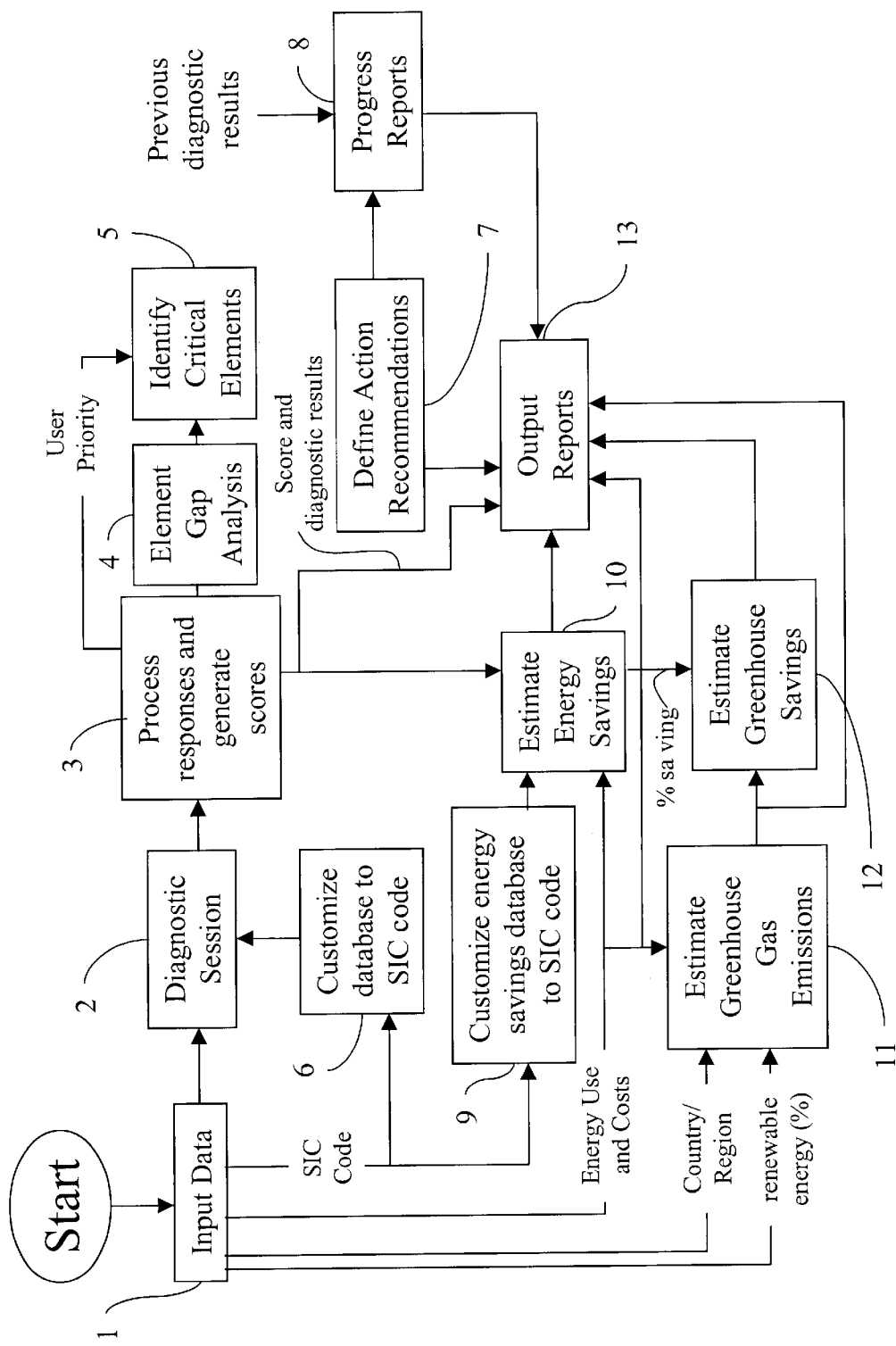
Figure 1 Overall Process

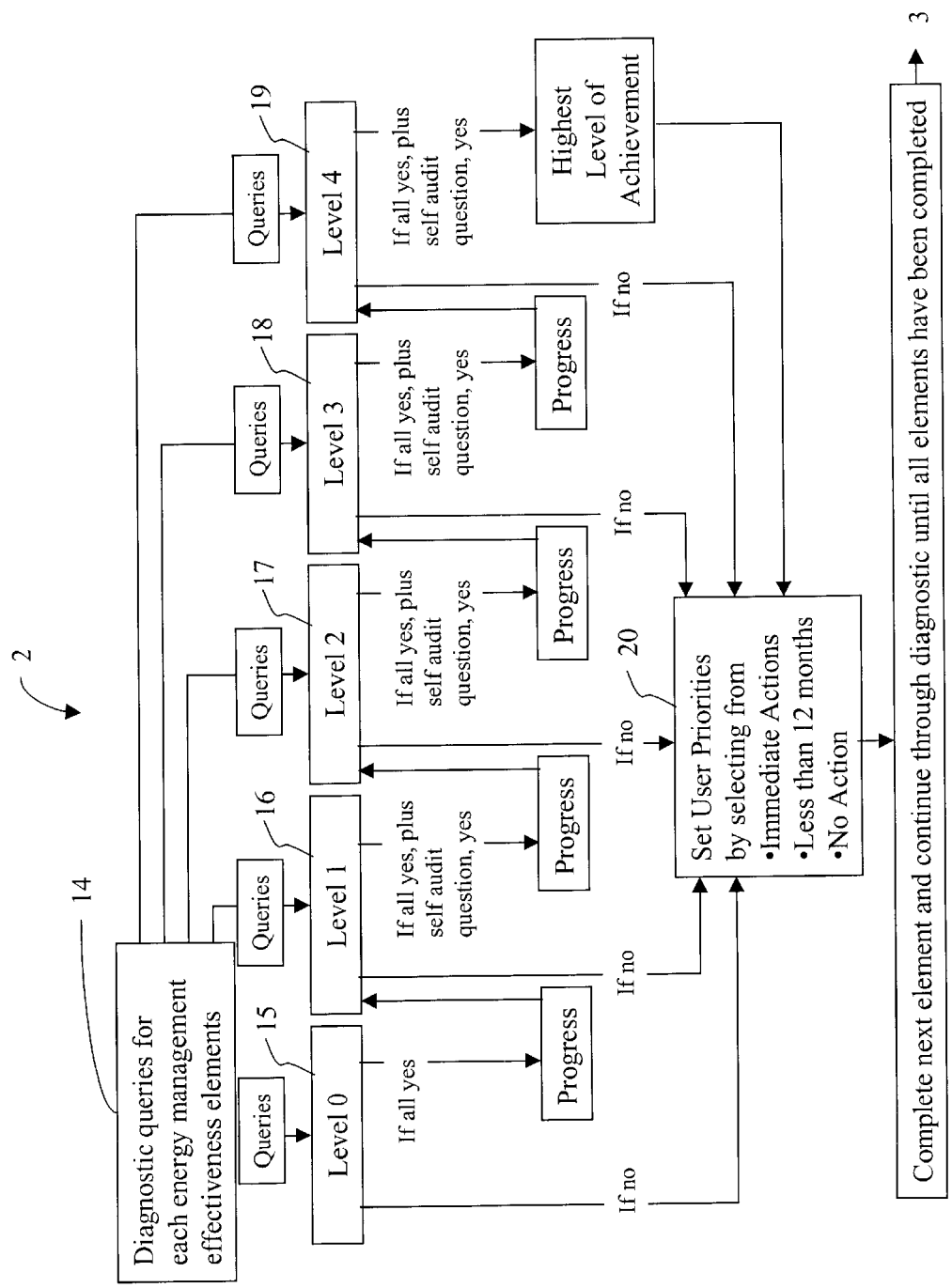
Figure 2. Diagnostic Session

COMPUTERIZED MANAGEMENT SYSTEM AND METHOD FOR ENERGY PERFORMANCE EVALUATION AND IMPROVEMENT

BACKGROUND OF THE INVENTION

1. Field of the Invention

This invention relates to a computerized method for establishing systems for managing the energy use of an energy consuming end user. It is particularly directed toward larger end users, be they corporate (industrial/commercial) or government/institutional for whom, controlling energy consumption and costs is generally done poorly, due to lack of formal management systems. The method and system of this invention facilitate development of strategies for reducing energy consumption and monitoring progress made on an ongoing basis toward the fulfillment of strategy objectives and, ultimately, a reduction in energy consumption and cost. All of this is achieved independently of any physical system by which the utilization of energy is controlled.

2. Description of Prior Art

Conventional energy management, particularly in commercial, corporate and industrial settings, is a technical process, often carried out by systems and methods which directly control energy consumption. Such energy management systems frequently involve measurement of one or more parameters associated with energy consumption. See, for example, U.S. Pat. No. 5,216,623 to Barrett et al., which teaches a system for monitoring various, diverse energy characteristics of an energy consuming system, which system includes a data gathering device that accumulates data representing each of the sensed energy characteristics in real time, which data represents the magnitude of the sensed energy characteristic as well as the time at which the magnitude is sensed. The data that is accumulated for each of the sensed energy characteristics is periodically transmitted to a remote analysis station where a detailed analysis of the sensed energy characteristics is performed and a report generated containing summaries of the sensed data in the form of listings of compressed data as well as graphs such as histograms and graphs correlating different energy characteristics of the energy consuming system.

U.S. Pat. No. 4,979,122 to Davis et al. teaches a method and apparatus for monitoring power in which a power monitor samples a plurality of line cycles during an observation window to generate a plurality of voltage-current sample sets for each line cycle. The sampling of the sample sets is timed such that the voltage-current sample sets are taken at different relative time positions. The power monitor stores incoming voltage-current sample data in one memory area and concurrently analyzes sample data already stored in another memory area.

U.S. Pat. No. 5,237,507 to Chasek teaches a system for developing real time economic incentives to encourage efficient use of the resources of a regulated electric utility. The system comprises sensors that monitor out-of-doors temperatures, mean power supplied by each generator in a utility system during each hour and energy consumed by each customer per hour recorded in calendar-time, computers that are programmed with software developed from algorithms which generate demand-related hourly prices and bonus/surcharge distributions while keeping gross revenues fixed and a subsystem that feeds back pricing information to consumers. Based upon information provided by the system, such as pricing information to consumers, energy utilization efficiency is promoted.

One problem associated with such prior art systems and methods is a tendency toward stagnation. That is, the ability to improve energy utilization efficiency is limited by the operating characteristic of the monitoring and control equipment. Once the equipment has been set up to provide a given improvement in energy utilization efficiency, there is no opportunity for further improving the energy utilization efficiency of the system.

Further, the approach generally taken for energy cost control up to this invention does not impact on management systems and practices of the user. Nor does it integrate with other improvement programs that may be undertaken by the user. Prior to this invention, there has been no way to quantify the effectiveness of management processes for energy cost control and as a result there was no process possible for benchmarking energy management practices. As a result, it was difficult for users to know how well they were performing.

SUMMARY OF THE INVENTION

Accordingly, it is one object of this invention to provide a method and system for energy management which is dynamic and, thus, provides the potential for continuously improving energy utilization efficiency up to an optimum efficiency level.

It is another object of this invention to provide a method and system for energy management which functions independently of any energy usage monitoring and control equipment.

It is yet another object of this invention to provide a computerized method for establishing management systems for use by energy consuming end users.

These and other objects of this invention are achieved by a computerized method for energy management comprising the steps of collecting data relating to energy usage and energy-related policies and practices in an automated data processing device, analyzing the data to derive a diagnosis of energy management effectiveness based upon analysis of a plurality of effectiveness elements, determining the relative priority for taking action for each of the effectiveness elements analysed and determining critical elements for action, generating recommendations for improving energy management effectiveness in each critical element, and benchmarking the result against those of other operations.

Diagnosis of energy management effectiveness in accordance with the method of this invention involves consideration of a plurality of effectiveness elements and a level of achievement made in each of the effectiveness elements. Thus, the diagnosis includes an indication of progress achieved with respect to each effectiveness element which, in turn, translates into a determination of actual performance with respect to goals set for each effectiveness element. The diagnosis also defines critical actions to be taken first in order to best effectuate the desired energy utilization objectives. It does this through a novel analysis process, which considers the gap between current practice and best practice in each element, and the priority level set by the user of the software. Information provided by the diagnosis can then be formulated into a series of reports by which the management of an organization can develop strategies, energy-related policies and practices for improving energy utilization efficiency. The diagnostic results can then be automatically benchmarked against other organizations on a web-site benchmarking database.

BRIEF DESCRIPTION OF THE DRAWINGS

These and other objects and features of this invention will be better understood from the following detailed description taken in conjunction with the drawings wherein:

FIG. 1 is a general flow diagram for the method of this invention; and

FIG. 2 is a detail of the diagnosis portion or session of the method of this invention.

DESCRIPTION OF PREFERRED EMBODIMENTS

The second set of data for input into the data processing device is energy use data, which is used (along with SIC code in the energy saving database 9) in the quantification of an organization's energy savings potential 10. In addition, it also contributes to the identification of opportunities for greenhouse gas emission reductions 11. The energy use data collected includes energy sources, for example electricity, natural gas or fuel oil, the annual consumption of each type of fuel and the annual cost for each type of fuel. Also included is data regarding the percentage of renewable energy utilized which is necessary for an accurate calculation of greenhouse gas emissions 11. As conditions change, the "input report" may be modified to reflect the changes.

The next step in the method of this invention is the analysis of the data to arrive at a diagnosis of energy management effectiveness. For details of the diagnostic procedure, see FIG. 2. Data analysis (diagnostic) involves consideration of a plurality of elements of effective energy management 13, each of which elements is considered on the basis of responses by a user to queries regarding each of the elements. The queries 14, presented in simple statement form, are typically statements of organizational attitude towards energy management and activities and practices related to the management of energy use. In each case, the user provides a response indicative of the level of progress made by the organization towards implementation of each of the queried actions. There are a defined set of queried actions corresponding to each level of progress 15, 16, 17, 18 and 19 towards achievement of each effective element to which the queries relate. At the outset, for each element, the initial level of achievement is the lowest level 15. The user may progress through to higher levels of achievement for each effectiveness element to the highest level 19 based upon positive user responses to the queries for each effective element, providing the user is also able to verify achievement of the requirements of a qualifying question ('self-audit' or 'challenger' question) which tests a practical example relating to the general statements at that level of progress. Thus, to move from Level 0 (15) to Level 1 (16), a user must respond in the affirmative to each of the queries for each effectiveness element for Level 0 (15). To move from Level 1 (16) to Level 2 (17), in addition to affirmatively responding to each of the queries, the user must also conduct a self-audit for verifying the achievement of the requirements thereof and, thus, confirm responses given to the queries. If the user is unable to respond affirmatively to all of the queries and verify the achievement of the requirements at any level of progress, the user does not move to the next level of progress, but rather is given the opportunity to set priorities 20 for actions to be taken to enable movement to the next level of progress. Such priorities include immediate action, action in less than 12 months and no action, as shown in FIG. 2. Responses to the queries for each effectiveness element are stored 3, thereby enabling a user to compare current levels of achievement to previous levels of achievement for a given effectiveness element 9. Upon completion of query responses for each effectiveness element 9, the effectiveness elements are subjected to a priority ranking 5. This ranking, to define 'critical' elements 5, is done utilizing an element gap analysis 4 (the higher priority being accorded to elements in which the gap between current practice and 'best' practice 19 is the largest), combined with a user priority setting defined for each effectiveness element by the user.

Upon completion of the data analysis, a diagnosis is derived for each of the effectiveness elements, which defines the level of development or achievement by the user with respect to each of the effectiveness elements, the priority given by the user to achievement of each of the effectiveness elements and an indication of effectiveness elements for which critical action 7 is required.

Examples of effectiveness elements include such things as "demonstrated corporate commitment", "planning processes", "awareness and training", "energy operating budgets", "operating procedures", "maintenance procedures", processes for auditing progress and the like.

As a result of the diagnosis, recommendations regarding actions to be taken for improving energy management effectiveness are generated automatically for each of the critical elements. Based upon the recommendations for improving energy management effectiveness, in accordance with one embodiment, the method of this invention further comprises generating an estimate of potehtial energy savings 10 upon achievement of all of the effectiveness elements. In accordance with another embodiment, the method of this invention further comprises generating an estimate of potential greenhouse gas emissions reductions 12 which may be achieved upon implementation of each of the effetiveness elements.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

We claim:

1. A computerized method for diagnosing and defining actions for improvement in energy management comprising the steps of:

collecting data relating to energy usage and energy-related policies and practices in an automated data processing device;

using a defined set of characteristics for each of a plurality of levels of achievement to derive a diagnosis of energy management effectiveness, said diagnosis comprising a plurality of effectiveness elements and a level of achievement for each said effectiveness element and allowing quantification of a status of energy management practices;

determining a relative priority for taking action for each of said effectiveness elements using an element gap analysis wherein a higher priority is accorded to those effectiveness elements in which a gap between a current practice and a best practice is the largest;

determining at least one critical element for action based upon the relative priority for taking action; and automatically generating recommendations for improving said energy management effectiveness for each of said critical elements.

2. A method in accordance with claim 1 further comprising benchmarking at least one result of the method against comparable user operations.

3. A method in accordance with claim 1 further comprising generating an estimate of potential energy savings.

4. A method in accordance with claim 1 further comprising generating an estimate of potential greenhouse gas emission reductions.

5. A method in accordance with claim 1, wherein said diagnosis and said recommendations are output to a display means.

6. A method in accordance with claim 5, wherein said display means is selected from the group consisting of a display monitor, a printer, an e-mail file and combinations thereof.

7. A method in accordance with claim 1, wherein each of said steps is repeated over time to derive an assessment of overall improvements in energy management effectiveness with time.

8. A computerized method for diagnosing and defining actions for improvement in energy management comprising the steps of:
   collecting data relating to energy usage and energy-related policies and practices in an automated data processing device;
   using a defined set of characteristics for each of a plurality of levels of achievement to derive a diagnosis of energy management effectiveness, said diagnosis comprising a plurality of effectiveness elements and a level of achievement for each said effectiveness element and allowing quantification of a status of energy management practices;
   determining a relative priority for taking action for each of said effectiveness elements using an element gap analysis, wherein a higher priority is accorded to those effectiveness elements in which a gap between a current practice and a best practice is the largest thereby defining at least one critical element;
   determining at least one critical element for action;
   automatically generating recommendations for improving said energy management effectiveness for each of said critical elements;
   benchmarking at least one result of the method against comparable user operations; and
   determining a level of progress for each of said plurality of effectiveness elements.

9. A management system for energy performance improvement comprising:
   means for collecting and storing data relating to energy usage and energy-related policies and practices;
   selecting a plurality of effectiveness elements from a group of management practices including: "demonstrated corporate commitment; "planning processes"; "awareness and training"; "energy operating budgets"; "operating procedures"; "maintenance procedures"; and "processes for auditing progress";
   means for deriving a diagnosis of energy management effectiveness using said collected and stored data, wherein said means for deriving a diagnosis includes using responses to a defined set of characteristics for each of the plurality of effectiveness elements and a level of achievement reached in each of the plurality of effectiveness elements;
   ranking the plurality of effectiveness elements by determining a relative priority for taking action for each of said effectiveness elements using an element gap analysis wherein a higher priority is accorded to those effectiveness elements in which a gap between a current practice and a best practice is the largest thereby defining at least one critical element; and
   means for automatically deriving recommendations for improving said energy management effectiveness.

10. A system in accordance with claim 9, wherein said diagnosis comprises a plurality of effectiveness elements and a level of achievement for each of said effectiveness elements.

11. A system in accordance with claim 9 further comprising means for generating an estimate of potential energy savings.

12. A system in accordance with claim 10 further comprising means for deriving a total greenhouse gas emissions based upon said energy usage.

13. A system in accordance with claim 12 further comprising means for estimating a potential for greenhouse gas emissions reduction.

14. A system in accordance with claim 10 further comprising means for determining a level of achievement for each of said effectiveness elements.

15. A computerized method for diagnosing energy management effectiveness and defining actions for improvement in energy management comprising the steps of:
   collecting data relating to energy usage and energy-related policies and practices in an automated data processing device;
   presenting a set of queried actions for each of a plurality of levels of achievement for each of a plurality of effectiveness elements;
   using responses to the set of queried actions for each effectiveness element to prioritize the plurality of effectiveness elements to define at least one critical element, wherein the prioritization comprises an element gap analysis of each effectiveness element so that a higher priority is accorded to those effectiveness elements in which a gap between a current practice and a best practice is the largest;
   diagnosing an energy management effectiveness for each effectiveness element wherein the level of achievement is defined by a user with respect to each effectiveness element, the user providing a priority to achievement of each effectiveness element;
   providing an indication of effectiveness elements for which critical action is required; and
   automatically generating recommendations for each effectiveness element regarding critical action to be taken for improving energy management.

16. A method in accordance with claim 15 further comprising generating an estimate of potential energy savings upon achievement of the plurality of effectiveness elements.

17. A method in accordance with claim 15 wherein the method is periodically repeated to compare newly obtained results with previous results to generate a progress report.

18. A method in accordance with claim 15 wherein the element gap analysis for each effectiveness element comprises a determination of a gap between a current practice and a best practice for the effectiveness element.

* * * * *

UNITED STATES PATENT AND TRADEMARK OFFICE
CERTIFICATE OF CORRECTION

PATENT NO.    : 6,701,298 B1
DATED         : March 2, 2004
INVENTOR(S)   : Jonathan Jutsen It is certified that error appears in the above-identified patent and that said Letters Patent is hereby corrected as shown below:

<u>Column 3,</u>
Line 7, under "DESCRIPTION OF PREFERED EMBODIMENTS" add:
 -- Disclosed herein is a management system for energy which, in addition to providing direction to improve energy utilization efficiency, also monitors the extent of achievement made towards reaching established energy efficiency goals. The method of this invention comprises four basic elements -- data input 1 relating to energy usage and energy-related policies and practices into an automated data processing device, derivation of a diagnosis of energy management effectiveness 2, the definition of critical actions for action 5 and generation of recommendations for improving energy management effectiveness 8. In accordace with one embodiment of this invention, results are benchmarked through an automatic 'hot-link' to a web-site database. In addition to providing an indication of the broad range of potential energy savings which can be achieved by improving the diagnostic energy score from its existing level to the best practice level, the method of this invention includes a further benefit, namely an estimate of a reduction in emissions, in the form of greenhouse gas emissions, which is potentially achievable by improving the diagnostic energy score from its existing level to the best practice level.
 The initial step in accordance with the method of this invention, as shown in Fig. 1, is the collection of data 1 relating to energy usage and energy-related policies and practices and inputting said data into an automated data processing device. The data to be input into the data processing device is broken down into at least two categories -- business data, that is information regarding the organization employing the method of this invention, and energy use data for such organization. Business data, which is only entered into the data processing device once, in addition to indentification of the organization, also includes a categorization of the organization based upon industry type in accordance with, for example, standard industrial classification (SIC) codes. The

UNITED STATES PATENT AND TRADEMARK OFFICE
CERTIFICATE OF CORRECTION

PATENT NO. : 6,701,298 B1
DATED : March 2, 2004
INVENTOR(S) : Jonathan Jutsen

It is certified that error appears in the above-identified patent and that said Letters Patent is hereby corrected as shown below:

Column 3, (cont'd),
software selects a customized question database 6 for the diagnostic based on the industry type selected. The type of industry in which the organization is engaged is important as a measure against which the progress of the organization with respect to energy utilization efficiency can be assessed (benchmarking). --.

Signed and Sealed this

Twenty-eighth Day of February, 2006

JON W. DUDAS
*Director of the United States Patent and Trademark Office*